United States Patent
Yamamoto et al.

[11] Patent Number: 6,129,145
[45] Date of Patent: Oct. 10, 2000

[54] HEAT DISSIPATOR INCLUDING COOLANT PASSAGE AND METHOD OF FABRICATING THE SAME

[75] Inventors: Yoshiyuki Yamamoto; Takahiro Imai, both of Itami, Japan

[73] Assignee: Sumitomo Electric Industries, Ltd., Osaka, Japan

[21] Appl. No.: 09/100,603

[22] Filed: Jun. 19, 1998

[30] Foreign Application Priority Data

Aug. 28, 1997 [JP] Japan ..................................... 9-232200

[51] Int. Cl.⁷ ................................ F28F 3/12; H05K 7/20
[52] U.S. Cl. ........................ 165/168; 165/80.4; 165/170; 165/133; 257/714; 361/699
[58] Field of Search .................... 165/80.4, 133, 165/168, 170, 169; 257/714; 361/699

[56] References Cited

U.S. PATENT DOCUMENTS

| | | | |
|---|---|---|---|
| 3,595,025 | 7/1971 | Stockel et al. | 165/169 X |
| 3,731,992 | 5/1973 | Mansell . | |
| 4,078,604 | 3/1978 | Christl et al. | 165/133 |
| 4,185,369 | 1/1980 | Darrow et al. | 165/170 X |
| 4,739,634 | 4/1988 | Watanabe | 165/169 X |
| 4,977,955 | 12/1990 | Schweizer | 165/170 |
| 5,300,810 | 4/1994 | Eden . | |
| 5,509,046 | 4/1996 | Logan . | |
| 5,642,779 | 7/1997 | Yamamoto et al. | 165/185 |
| 5,737,186 | 4/1998 | Fuesser et al. | 361/699 |
| 5,804,086 | 9/1998 | Bruel . | |

FOREIGN PATENT DOCUMENTS

| | | |
|---|---|---|
| 0715352 | 6/1996 | European Pat. Off. . |
| 8-227953 | 9/1996 | Japan . |
| 8-227956 | 9/1996 | Japan . |
| 758524 | 10/1956 | United Kingdom .......... 165/80.4 |
| 2300071 | 10/1996 | United Kingdom . |
| 2300072 | 10/1996 | United Kingdom . |

OTHER PUBLICATIONS

Article entitled "Cold Plate With Nested Cover for D Circuit Module", by R. C. Chu et al., IBM Technical Disclosure Bulletin, vol. 24, No. 11B, Apr. 1982, pp. 6137–6138, New York, US.

Article entitled: "Fabrication of Microchannels in Synthetic Polycrystalline Diamond Thin Films for Heat Sinking Applications", by R. Ramesham et al.; J. Electrochem. Soc., vol. 138, No. 6, Jun. 1991, pp. 1706–1709.

*Primary Examiner*—Leonard Leo
*Attorney, Agent, or Firm*—W. F. Fasse; W. G. Fasse

[57] ABSTRACT

A heat dissipator includes a heat-conductive substrate, a lid and a heat-conductive cover layer, and a coolant groove for passing a coolant therethrough is formed on a major surface of the substrate. The lid is positioned on the coolant groove to seal the same, and the cover layer covers the major surface of substrate and the lid. The lid may be received in a lid groove to be flush with the major surface of the substrate. The substrate, lid and cover layer are all made of diamond, and are joined together with substantially no other material therebetween. Thus, a high heat conductivity is achieved. The heat dissipator can be a heat dissipating substrate for an electronic component, or an optical transmission window.

24 Claims, 5 Drawing Sheets

HEAT DISSIPATOR INCLUDING COOLANT PASSAGE AND METHOD OF FABRICATING THE SAME

BACKGROUND OF THE INVENTION

1. Field of the Invention

The present invention relates to a heat dissipator including a coolant passage, and more particularly, it relates to a heat dissipator which is preferably emloyable as a cooling substrate for a semiconductor device generating a large quantity of heat or a transmission window for high-energy light.

2. Description of the Prior Art

In response to the increasing requirement for longdistance transmission or the like, the output power of a semiconductor laser employed for optical communication is increased. As a consequence, the heat generated from a semiconductor element itself is also increased. Further, improvement of performance and miniaturization of a portable information system device by results in an increase of the generated heat per unit surface area in a semiconductor element included in the device.

At present, it becomes a problem that the heat radiability of a material such as alumina, which is mainly applied to a radiating substrate for such a semiconductor element, is insufficient in case of packaging the aforementioned semiconductor element of high performance. Namely, the specific heat conduction resistance of the conventional radiating substrate itself is too high to sufficiently dissipate heat generated from the semiconductor element to the ambient environment. In order to solve this problem, it is effective to employ a material having higher heat conductivity in place of the conventional material such as alumina. It is now being started to use diamond, which has; the highest heat conductivity among the existing materials, for a radiating substrate for a semiconductor laser diode or the like.

Requirements for various optical windows as used in a large-scale synchrotron radiation experimental apparatus or the like, tend to become more strict with respect to intensity of light to be transmitted and environment where the windows are to be used. Thus, it is predicted that requirements for various physical properties such as the mechanical strength of the window, endurance for radiation and the like hereafter become more strict.

While Be, Si, ZnSe, NaCl and the like are employed as the materials for various types of optical windows, these window materials generally have very small heat conductivities. If windows made of such materials are irradiated with high-energy light, therefore, the temperatures of the irradiated surfaces of the windows themselves are increased to cause problems such as fusion, alteration and breakage. Thus, the light energy levels allowing employment of these windows are restricted.

On the other hand, diamond, which can transmit light over an extremely wide range covering vacuum ultraviolet rays, visible rays and infrared rays, serves as a superior optical window material. In general, however, a window formed of diamond can be cooled only from its periphery. Thus, it is predicted that the diamond window is insufficiently cooled as its size is increased.

Heat transported by the radiating substrate must be finally transmitted to the external air or water, to be dissipated. Similarly, heat generated from the window must also be finally dissipated to the external air or water. As to both of the radiation substrate and the window, heat-conductive materials must be used as thermal loads applied thereto are increased as a matter of course, while the conducted heat must be efficiently removed from the substrate and the window. To this end, a fin or a coolant pipe is mounted on the rear surface of the heat radiation substrate, to increase the radiating area and the radiation efficiency. However, additional heat conduction resistance is inevitably caused on the mounting portion if the cooling pipe is mounted on the rear surface of the substrate, while the fin is insufficient in cooling efficiency. In case of the window, on the other hand, a cooling pipe mounted on its rear surface results in a problem in compatibility with light transmittance.

Japanese Patent Laying-Open No. 4-273466 (1992) proposes a structure of feeding a coolant to a three-dimensional integrated circuit board formed of stacked diamond substrates by providing holes passing through the circuit board along its thickness in side edge portions thereof. In this structure, however, a portion around the center of the board, i.e. that predicted to be most increased in temperature in practice, is farthest from the holes for passing the coolant, to result in inferior heat dissipativity.

Each of Japanese Patent Laying-Open Nos. 8-227953 (1996) and 8-227956 (1996) discloses a cooling substrate including passages for coolant in parallel with the substrate surface and a method of fabricating the same. In fabrication of this cooling substrate, coolant grooves are formed on a major surface of a thin plate (e.g., a diamond thin plate) of a heat-conductive material having heat conductivity of at least 10 W/cm·K by working with a laser beam, selective vapor deposition or selective etching. The surface of the heat-conductive thin plate provided with the coolant grooves is bonded to a base material, thereby obtaining the cooling substrate. The heat-conductive thin plate provided with the coolant grooves can alternatively be bonded to another heat-conductive thin plate. However, an adhesive intervenes in such a cooling substrate and it reduces the heat conductivity or light transmittance of the cooling substrate. Further, it is likely that the adhesive flows into the coolant grooves during the bonding step, reducing the product yield. In case of forming the coolant grooves by selective vapor deposition or selective etching, further, it takes time to form and remove a mask.

Each of Japanese Patent Laying-Open Nos. 8-293573 (1996) and 8-325097 (1996) proposes a micro cooling device having a passage structure for passing coolant therein, a complex device for electronic components and methods of fabricating the same. The passage structure is formed with a substrate having linear cavities and a cover layer for covering these cavities relative to the exterior. The cover layer is electrically insulative and heat-conductive, and a vapor-deposited diamond layer is concretely proposed therefor. In such prior art, however, it is likely that the cover layer enters the cavities, filling the same. Further, most parts of inner walls of the passages for the coolant have low heat conductivity and high heat conduction resistance. In addition, nothing is mentioned as to light transmittance of the substrate.

J. Electrochem. Soc., Vol. 138, 1991, pp. 1706–1709 discloses a diamond heat sink having microchannels for passing coolant therethrough. In this diamond heat sink, an $SiO_2$ layer is formed on inner walls of the groove-shaped microchannels formed on an Si substrate, for suppressing diamond growth thereon, thereby preventing the microchannels from being filled. It is described that the microchannels can be substantially covered with diamond layers by continuing diamond synthesis for about 80 hours. However, it is likely that the diamond layers grown crosswise over openings of the groove-shaped microchannels cannot be completely joined to and integrated with each other, and the product yield is industrially reduced due to leakage of the coolant or the like. Also in this case, the grooves are formed on the substrate side of the coolant passages, and hence the heat sink disadvantageously has high heat conduction resistance, similarly to Japanese Patent Laying-Open No. 8-293573. In addition, no consideration is made as to light transmittance of the substrate.

As hereinabove described, the conventional radiating substrate or high-energy light window is limited in heat radiability. In the radiating substrate including coolant passages, further, improvement of the heat radiability is limited due to the heat conduction resistance of the mounting portions for the passages or due to problems in the fabrication process. In case of applying a radiating substrate including coolant passages to a window, it is difficult to obtain a window which can transmit light of a wide wavelength range over a wide area while implementing high heat radiability in the prior art.

SUMMARY OF THE INVENTION

In consideration of the aforementioned problems of the prior art, an object of the present invention is to provide a heat dissipator having an excellent cooling property and a method of fabricating the same. Another object of the present invention is to provide a heat dissipator having excellent light transmittance and a method of fabricating the same.

A heat dissipator including a coolant passage according to an aspect of the present invention includes a heat-conductive substrate, a lid and a heat-conductive cover layer. A coolant groove for passing coolant therethrough is formed on a major surface of the substrate. The lid is positioned over the coolant groove to seal the same, and the cover layer covers the major surface of the substrate and the lid.

A method of fabricating a heat dissipator according to another aspect of the present invention includes steps of preparing a heat-conductive substrate, forming a coolant groove for passing coolant therethrough on a major surface of the substrate, positioning a lid over the coolant groove for sealing the same, and forming a heat-conductive cover layer to cover the major surface of the substrate and the lid.

According to the present invention, the lid seals the coolant groove, so that the cover layer will not fill the coolant groove. Further, no adhesive intervenes in the interfaces between the substrate, the lid and the cover layer, whereby an excellent heat dissipator having small heat conduction resistance is obtained. Further, all of the substrate, the lid and the cover layer can be made of light-transmittable materials, whereby a high-energy window having both excellent heat dissipativity and light transmittance can be obtained by limiting a region occupied by the coolant groove to not more than a constant ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
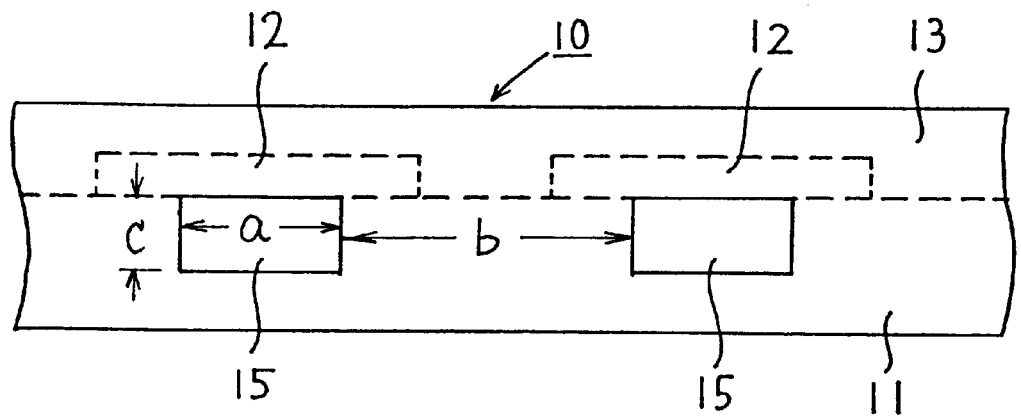
FIG. 1 is a sectional view schematically showing a heat dissipator according to an embodiment of the present invention.
Figure 2:
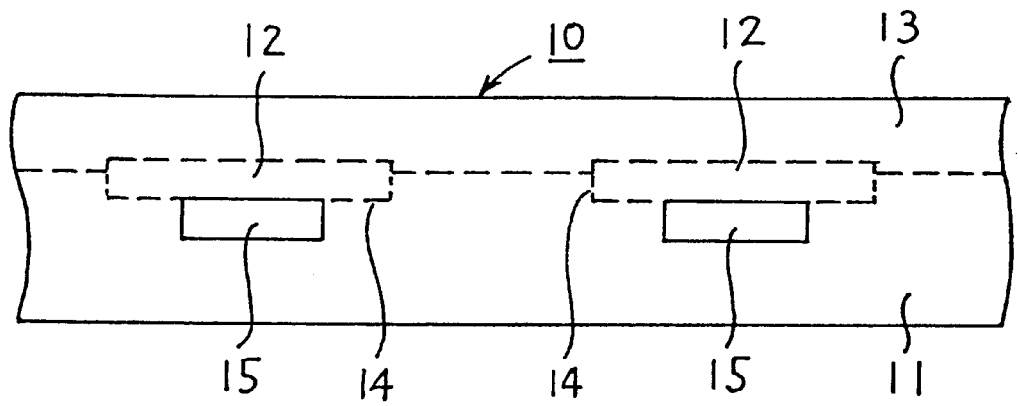
FIG. 2 is a schematic sectional view showing a heat dissipator according to another embodiment of the present invention.
Figure 3:
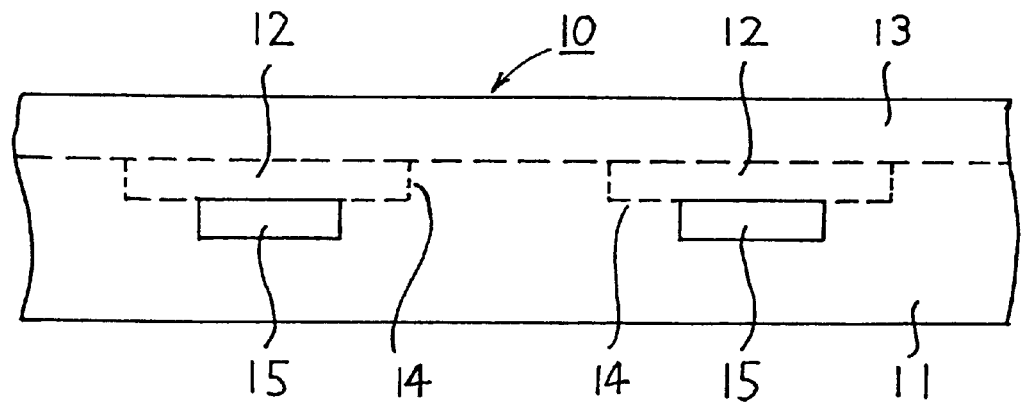
FIG. 3 is a schematic sectional view showing a heat dissipator according to still another embodiment of the present invention.

In FIGS. 1, 2 and 3, there are shown schematic sectional views of heat dissipators including coolant passages according to some preferred embodiments of the present invention. In the drawings in this application, identical reference numerals denote the same or similar parts.

Referring to FIG. 1, the heat dissipator 10 includes a heat-conductive substrate 11. Coolant grooves 15 for passing coolant therethrough are formed on an upper surface of the substrate 11. Lids 12 seal the coolant grooves 15. A heat-conductive cover layer 13 covers the lids 12 and the upper surface of the substrate 11.

Also in the heat dissipator 10 shown in FIG. 2, coolant grooves 15 are formed on an upper surface of a heat-conductive substrate 11. The heat dissipator 10 shown in FIG. 2 is further provided with lid grooves 14 for positioning and receiving lids 12 over the coolant grooves 15.

The heat dissipator 10 shown in FIG. 3 has lid grooves 14, similarly to that shown in FIG. 2. In the heat dissipator 10 shown in FIG. 3, however, the depth of the lid grooves 14 is equal to the thickness of lids 12. Therefore, upper surfaces of the lids 12 received in the lid grooves 14 are flush with an upper surface of a substrate 11.

The heat-conductive substrate 11 shown in FIGS. 1, 2 or 3 preferably has the highest possible heat conductivity, preferably at least 10 W/cm.K, in order to attain the objects of the present invention. The material for such a substrate 11 may be prepared from natural diamond or high-pressure-synthetic diamond, while vapor-deposited diamond, which can form a heat-conductive substrate having a larger area at a low cost, is particularly preferable. If the thickness of the substrate 11 is too small, the mechanical strength is unpreferably reduced. If the thickness is too large, on the other hand, the cost for the substrate 11 is unpreferably increased and a heat conduction distance along its thickness is also unpreferably increased. If the thickness of the substrate 11 is excessive, further, the light transmittance is disadvantageously reduced when the heat dissipator 10 is employed as a window. Therefore, the thickness of the substrate 11 is preferably in the range of 0.03 to 5 mm, and more preferably 0.07 to 2 mm. Further, the heat-conductive substrate 11 may be electrically semi-conductive or conductive, but is preferably insulative. Its electrical resistivity is preferably at least $1 \times 10^8 \Omega$cm, and more preferably at least $1 \times 10^9 \Omega$cm.

The heat-conductive cover layer 13 is so provided as to cover the upper surface of the substrate 11 and the overall lids 12. The heat-conductive cover layer 13, which must have high heat conductivity as a matter of course, must seal the coolant grooves 15 provided on the heatconductive substrate 11, for preventing leakage of the coolant fed therein, with excellent adhesion to the substrate 11. To this end, a diamond layer obtained by vapor deposition is most suitable as the material for the heat-conductive cover layer 13. It is difficult to completely seal the coolant grooves 15 if the thickness of the cover layer 13 is too small, while the cost is increased if the thickness is too large. Therefore, the thickness of the cover layer 13 is preferably in the range of 0.02 to 0.4 mm, and more preferably 0.05 to 0.35 mm.

The lids 12, which are positioned to seal upper openings of the coolant grooves 15, are necessary for preventing the coolant grooves 15 from being filled with the heat-conductive cover layer 13. The lids 12 are preferably made of a material allowing formation of the heat-conductive cover layer 13 with excellent adhesion, and preferably has high heat conductivity. To this end, diamond plates obtained by vapor deposition are most suitable for forming the lids 12. The lids 12 are mechanically weakened if the thickness thereof is too small. If the thickness of the lids 12 is too large, on the other hand, the cover layer 13 covering the upper surface of substrate 11 and the lids 12 cause a remarkably irregular upper surface when no lid grooves 14 are formed. If the thickness of the lids 12 is too large, further, it is difficult to most preferably form the lid grooves 14 in the depth which is equal to the thickness of the lids 12 as shown in FIG. 3. Therefore, the thickness of the lids 12 is preferably in the range of 0.02 to 0.5 mm. The width of the lids 12 must be larger than that of the coolant grooves 15 to be sealed. If the width of the lids 12 is too large, however, the cover layer 13 cannot successfully seal the coolant grooves 15. Therefore, the width of the lids 12 is preferably not more than sum greater than the width of the coolant grooves 15.

The coolant grooves 15 are provided for passing the coolant therethrough in parallel with the major surface of the heat dissipator 10. While the heat exchange rate is improved as the depth of the coolant grooves 15 is increased, the mechanical strength of the substrate 11 is unpreferably reduced if the depth of the coolant grooves 15 is too large. Therefore, the depth of the coolant grooves 15 is preferably at least 20 $\mu$m, more preferably at least 50 $\mu$m, while the depth is preferably not more than 90%, more preferably not more than 80% of the thickness of the heat-conductive substrate 11. The width of the coolant grooves 15 is also preferably increased in view of the heat exchange rate, while the mechanical strength of the substrate 11 and its light transmittance for serving as a window are badly influenced if the width is too large. Therefore, the width of the coolant grooves 15 is preferably in the range of 20 $\mu$m to 10 mm, and more preferably 40 $\mu$m to 2 mm. Further, the ratio a/b of the width a of the coolant grooves 15 to the distance b therebetween (refer to FIG. 1) is preferably within the range of $0.02 \leq (a/b) \leq 50$, and more preferably $0.04 \leq (a/b) \leq 25$. The coolant grooves 15 can be formed in a rectangular sectional shape. In this case, the ratio a/c of the width a of the coolant grooves 15 to the depth c thereof (refer to FIG. 1) is preferably within the range of $0.05 \leq (a/c) \leq 100$, and more preferably $0.1 \leq (a/c) \leq 50$.

However, the optimum width and depth of the coolant grooves 15 and the optimum distance therebetween are selected depending on a thermal or mechanical load which is applied to the heat dissipator 10. Further, the sectional shape of the coolant grooves 15 may not necessarily be rectangular, but the grooves 15 may be formed in an arbitrary sectional shape such as a semicircular or semielliptic shape if desired, as a matter of course. Further, the width a and the depth c of the coolant grooves 15 and the distance b therebetween may not be constant but may be changed within the aforementioned ranges. The ratio of the coolant grooves 15 occupying the upper surface of the substrate 11 is preferably within the range of 2 to 90%, and more preferably 10 to 80%. The angle (taper angle) formed between each side surface of the coolant grooves 15 and a line perpendicular to the upper surface of the substrate 11 is preferably not more than 30°.

The distribution density of the coolant grooves 15 provided on the substrate 11 can be properly adjusted depending on distribution of the thermal load which is applied to the heat dissipator 10. For example, the coolant grooves 15 are preferably so formed as to most efficiently cool a portion most generating heat or a portion to be at the lowest temperature in an electronic apparatus mounted on the heat dissipator 10.

Inner walls of the coolant grooves 15 preferably have excellent wettability with respect to the coolant, and non-diamond carbon layers (layers consisting of graphite or amorphous carbon, for example) having a thickness in the range of 1 nm to 1 $\mu$m may be formed thereon. Such non-diamond carbon layers can be formed by heating the diamond substrate 11 in a non-oxidizing atmosphere such as an inert gas atmosphere at a temperature within the range of 1000 to 1500° C. for 30 minutes to 10 hours (e.g., 1 hour). While additional nondiamond carbon layers are formed on surface parts of the substrate 11 other than the inner walls of the coolant grooves 15, such additional layers can be removed by polishing or the like. Presence or absence of a non-diamond carbon component can be evaluated by Raman spectroscopy, for example.

As hereinabove described, the inner walls of the coolant grooves 15 preferably have excellent wettability with respect to the coolant, and the contact angle in wetting with the coolant is preferably not more than 65° in general, and more preferably not more than 60°. Surfaces of vapor-deposited diamond, which contain hydrogen atoms in general, tend to repel the coolant such as water. In this case, hydrophilicity of the diamond surfaces can be improved by providing hydrophilic groups (e.g., OH group) containing oxygen atoms in place of the hydrogen atoms. To this end, the diamond surfaces may be annealed in an oxidizing atmosphere such as the air at a temperature within the range of 500 to 800° C. for a time within the range of 10 minutes to 10 hours, or treated with plasma of oxygen or gas containing oxygen.

The lids 12 are so positioned as to seal the upper openings of the coolant grooves 15, as shown in FIG. 1. Corner portions between upper and side surfaces of the lids 12 are preferably loosely chamfered. This is because the quality of the heat-conductive cover layer 13 is readily reduced at the corner portions of the lids 12 in formation of the cover layer 13 and chamfering of the corner portions provides an effect of reducing such quality deterioration of the cover layer 13.

When the lids 12 are positioned to seal the coolant grooves 15, the lid grooves 14 are preferably provided to overlap with upper portions of the coolant grooves 15, as shown in FIG. 2. Such lid grooves 14 simplify positioning of the lids 12, stabilize the positioned lids 12, and remarkably improve the production yield of the heat dissipator 10. More preferably, the depth of the lid grooves 14 is equal to the thickness of the lids 12. Due to provision of such lid grooves 14, the upper surfaces of the positioned lids 12 are flush with that of the substrate 11, whereby irregularity on the upper surface of the heat-conductive cover layer 13 covering the same can be reduced and a surface polishing step for the cover layer 13 is simplified.

All of the heat-conductive substrate 11, the lids 12 and the heat-conductive cover layer 13 are preferably made of vapor-deposited diamond. In this case, it is possible to obtain a heat dissipator 10 having high heat conductivity and very high light transmittance while containing substantially no impurities. Such a heat dissipator 10 can be employed as a cooling substrate including no layer of high heat conduction resistance and having excellent heat radiability and cooling property, or as an optical window having excellent transmittance in relation to light of a wide wavelength range over a wide area with excellent heat dissipativity.

A method of fabricating the heat dissipator 10 shown in FIGS. 1, 2 or 3 is now described. First, the heat-conductive substrate 11 of a prescribed shape is prepared so that the coolant grooves 15 are formed on its upper surface. The lid grooves 14 are also formed on the upper portions of the coolant grooves 15, if desired. Then, the lids 12 are prepared and positioned to seal the coolant grooves 15. The heat-conductive cover layer 13 is formed to cover the positioned lids 12 and the upper surface of the heat-conductive substrate 11, thereby completing the heat dissipator 10.

In case of preparing the heat-conductive substrate 11 of a desired shape from vapor-deposited diamond, a base material for synthesizing diamond is first prepared. Such a base material can be prepared from Si, SiC, Mo, $Si_3N_4$ or the like. A diamond plate is grown on such a base material by a well-known vapor deposition method such as a combustion flame method, hot filament CVD, microwave plasma assisted CVD or the like. Among such methods, the microwave plasma assisted CVD, which can readily obtain vapor-deposited diamond of high purity, is particularly preferable. Thereafter the base material is removed by a proper method such as dissolution with acid or grinding, whereby a vapor-deposited diamond plate can be obtained.

The coolant grooves 15 are formed on a major surface of the vapor-deposited diamond plate (which is flattened by polishing or the like as needed), by well-known laser beam machining (refer to Japanese Patent Laying-Open No. 8-227953), selective etching (refer to Japanese Patent Laying-Open No. 8-227953) or selective vapor deposition (refer to Japanese Patent Laying-Open No. 8-227956).

The lids 12 can be obtained by depositing diamond plates on proper base materials by well-known vapor deposition and removing the base materials (and through surface flattening and cutting as needed), similarly to the heat-conductive substrate 11. The lids 12 are positioned on the coolant grooves 15 of the heat-conductive substrate 11. If the lid grooves 14 are formed to overlap with the upper portions of the coolant grooves 15, the lids 12 can be quickly and reliably positioned and settled.

Thereafter a diamond layer is grown as the heat-conductive cover layer 13 by well-known vapor deposition, to cover the positioned lids 12 and the upper surface of the heat-conductive substrate 11. Due to such vapor deposition of the heat-conductive cover layer 13, the lids 12 can be readily fixed and the coolant grooves 15 can be reliably sealed. At this time, the coolant grooves 15 are not filled with the heat-conductive cover layer 13, because of the presence of the lids 12. Further, since brazing metal is not needed to fix the lids 12, it is not necessary to worry that the coolant grooves 15 are filled with the brazing metal.

The heat dissipator 10 obtained in the aforementioned manner, which is made of only diamond substantially in all parts and contains no impurities such as brazing metal, has not only excellent heat dissipativity but also excellent optical characteristics, and is preferably employable as a radiation substrate, a cooling substrate or a high-energy light window.

Some Examples of the inventive heat dissipator are now described in more concrete terms.

EXAMPLE 1

Diamond thin plates were grown on two scarified polycrystalline Si base materials of 20×20×2 $mm^3$ by microwave plasma assisted CVD under growth conditions of source gas containing methane of 1.5% and hydrogen, pressure of 85 Torr and a growth temperature of 930° C. The surfaces of the grown diamond thin plates were polished and the Si base materials were dissolved with acid, thereby obtaining two free-standing diamond thin plates A and B of 20×20×0.5 $mm^3$ and 20×20×0.2 $mm^3$ respectively. The heat conductivity of these free-standing diamond thin plates was 18 W/cm·K.

Figure 4A:
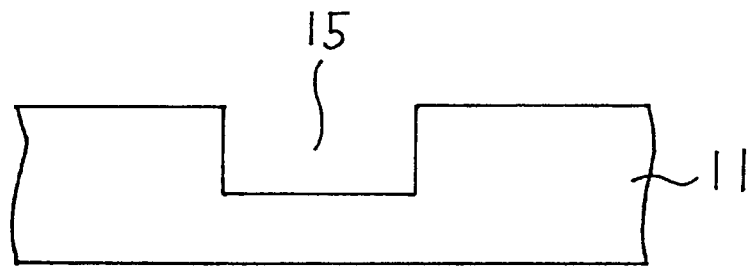
FIGS. 4A to 4D are schematic sectional views showing a process of fabricating a heat dissipator according to Example 1 of the present invention.
Figure 4B:
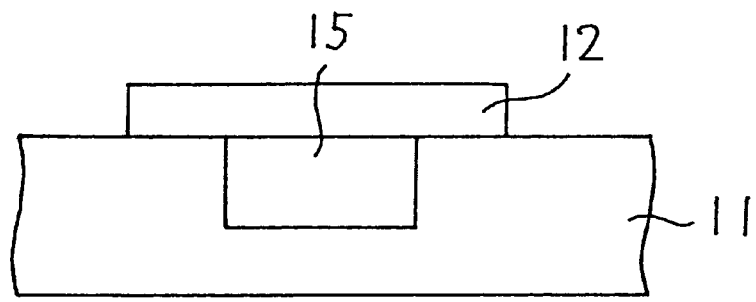

A KrF excimer laser beam was linear-focused or point-focused on an upper surface of a substrate 11 consisting of the free-standing diamond thin plate A, to form a coolant groove 15 as shown in FIG. 4A. This coolant groove 15 had a depth of about 125 μm and a width of about 800 μm, and the distance between such grooves 15 was about 900 μm. On the other hand, the free-standing diamond thin plate B was cut with a laser beam, and positioned on the coolant groove 15 as a lid 12, as shown in FIG. 4B.

Figure 4C:
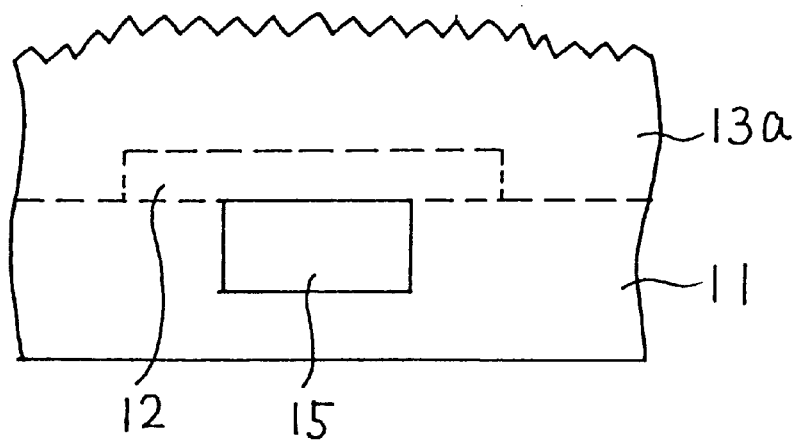

Then, a diamond layer 13a was grown by hot filament CVD to cover the lid 12 and the upper surface of substrate 11, as shown in FIG. 4C. This diamond layer 13a was grown under growth conditions of source gas containing methane of 1% and hydrogen, a filament temperature of 2200° C., a filament-to-base distance of 6 mm, pressure of 80 Torr and a growth temperature of 880° C.

Figure 4D:
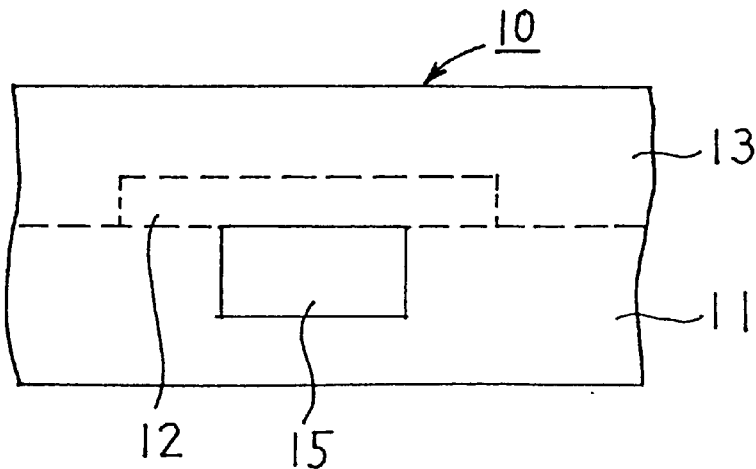

Thereafter the surface of the grown diamond layer 13a was mechanically polished, to obtain a heat dissipator 10 of 20×20×1 $mm^3$ as shown in FIG. 4D. Cooling water of 25° C. was supplied to the coolant groove 15 of this heat dissipator 10. While the pressure of this water was increased to 3 $kgf/cm^2$, neither leakage nor clogging was recognized in the coolant groove 15.

EXAMPLE 2

Two polycrystalline Si base materials similar to those in Example 1 were prepared to grow diamond thin plates thereon by hot filament CVD under growth conditions of source gas containing methane of 1% and hydrogen, pressure of 90 Torr, a filament temperature of 2100° C. and a filament-to-base distance of 8 mm. Surfaces of the grown diamond thin plates were polished and the Si base materials were dissolved with acid, thereby obtaining two free-standing diamond thin plates C and D of 20×20×0.6 $mm^3$ and 20×20×0.3 $mm^3$ respectively. The heat conductivity of these free-standing diamond thin plates was 14 W/cm·K.

Figure 5A:
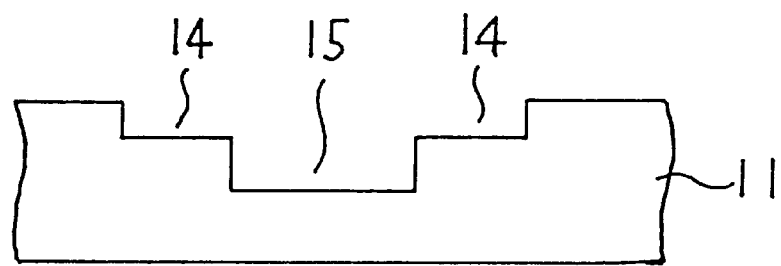
FIGS. 5A to 5D are schematic sectional views showing a process of fabricating a heat dissipator according to Example 2 of the present invention.
Figure 5B:
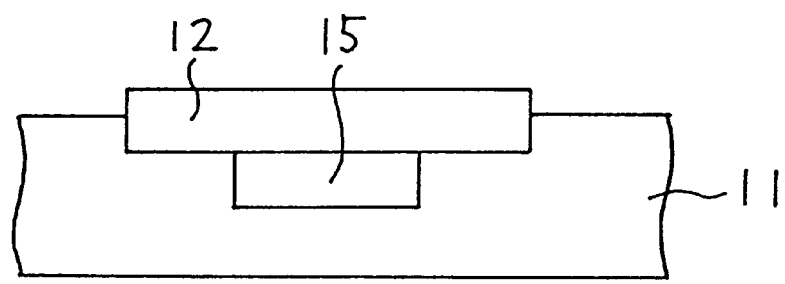

A laser beam was point-focused or linear-focused on an upper surface of a substrate 11 consisting of the free-standing diamond thin plate C obtained in the aforementioned manner similarly to Example 1, thereby forming a coolant groove 15 and lid grooves 14 as shown in FIG. 5A. In this case, the coolant groove 15 had a width of about 700 μm and a depth of about 250 μm, while the lid grooves 14 had a width of about 1700 μm and a depth of about 150 μm. On the other hand, the free-standing diamond thin plate D was cut with a laser beam as a lid 12, which in turn was positioned and settled in the lid grooves 14 as shown in FIG. 5B. At this time, it was possible to further readily and reliably position and settle the lid 12 as compared with Example 1, due to the provision of the lid grooves 14.

Figure 5C:
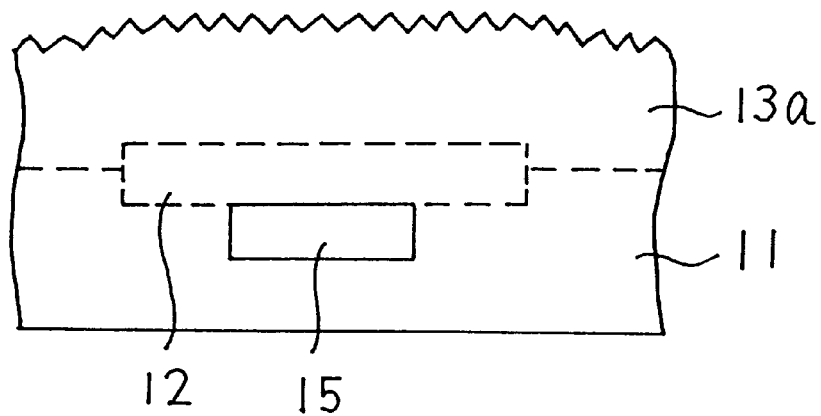
Figure 5D:
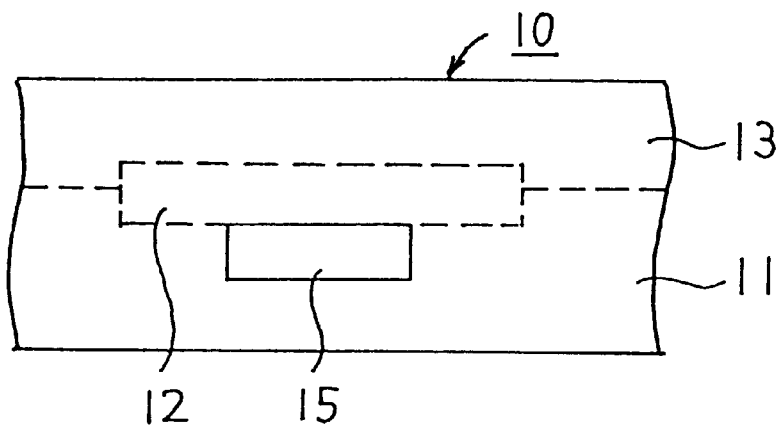

Thereafter a diamond layer 13a was grown by hot filament CVD, to cover the lid 12 and the upper surface of substrate 11 as shown in FIG. 5C, under growth conditions similar to those for the free-standing diamond thin plates C and D. The surface of the grown diamond layer 13a was mechanically polished, to obtain a heat dissipator 10 of 20×20×0.9 mm$^3$ as shown in FIG. 5D. While cooling water of 25° C. was supplied into the coolant groove 15 of this heat dissipator and the pressure of this water was increased to 3 kgf/cm$^2$, neither leakage nor clogging was recognized.

EXAMPLE 3

Figure 6A:
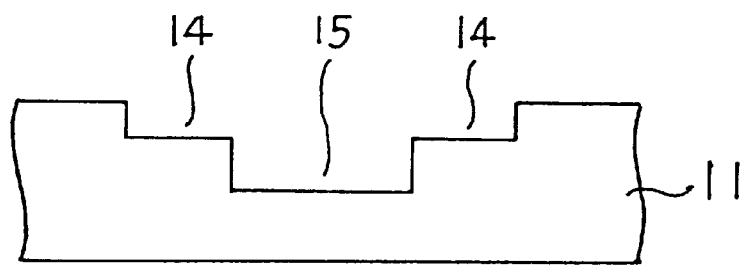
FIGS. 6A to 6D are schematic sectional views showing a process of fabricating a heat dissipator according to Example 3 of the present invention.
Figure 6B:
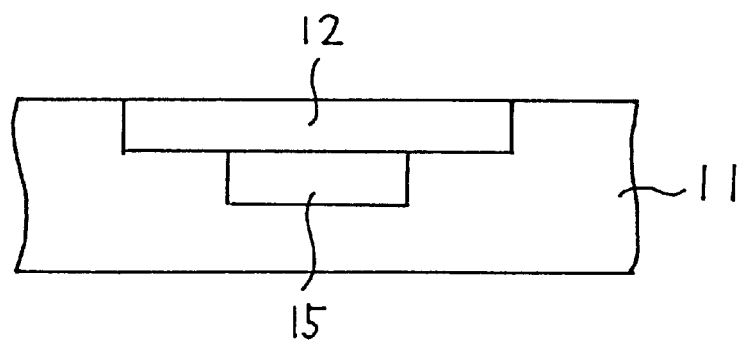

Two free-standing diamond thin plates E and F of 20×20× 0.6 mm$^3$ and 20×20×0.2 mm$^3$ respectively were obtained by microwave plasma assisted CVD, similarly to Example 1. A laser beam was point-focused or linear-focused on an upper surface of a substrate 11 consisting of the free-standing diamond thin plate E similarly to Example 2, thereby forming a coolant groove 15 and lid grooves 14 as shown in FIG. 6A. The coolant groove 15 had a width of about 800 μm and a depth of about 200 μm, while the lid grooves 14 had a width of about 2000 μm and a depth of about 200 μm. On the other hand, the free-standing diamond thin plate F was cut with a laser beam as a lid 12, which in turn was positioned and settled in the lid grooves 14 as shown in FIG. 6B. In this case, it was possible to readily and reliably position and settle the lid 12 as compared with Example 1, due to the provision of the lid grooves 14.

Figure 6C:
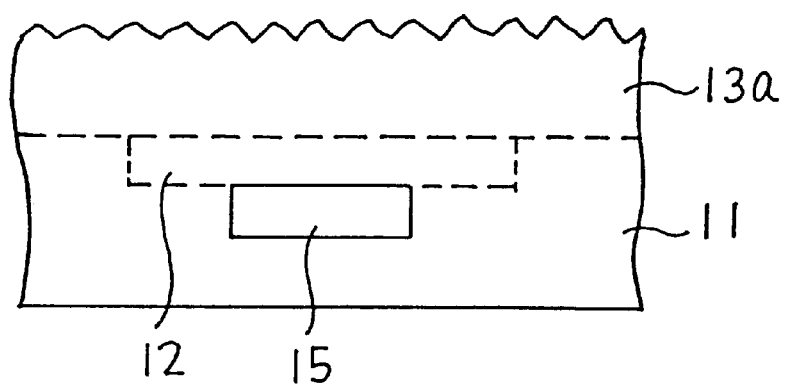
Figure 6D:
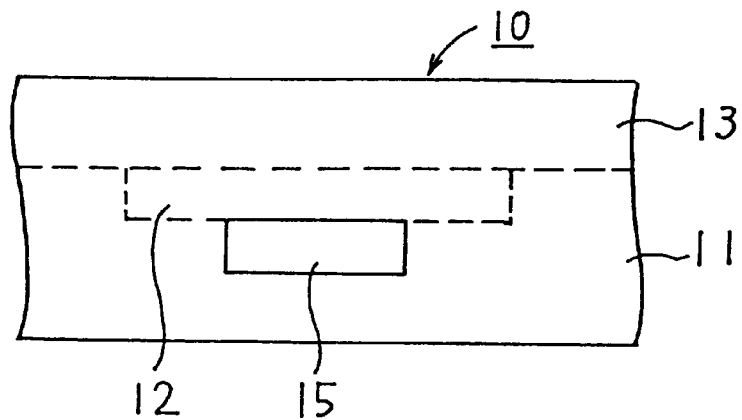

Thereafter a diamond layer 13a was grown by microwave plasma assisted CVD, to cover the lid 12 and the upper surface of substrate 11 as shown in FIG. 6C. Growth conditions for the diamond layer 13a were similar to those for synthesizing the diamond thin plates A and B of Example 1. The surface of the grown diamond layer 13a shown in FIG. 6C was mechanically polished, to obtain a heat dissipator 10 of 20×20×0.8 mm$^3$, as shown in FIG. 6D. At this time, an upper surface of the lid 12 was flush with that of the substrate 11, whereby irregularity on an upper surface of the diamond layer 13a was relatively small and polishing ended in a short time. While cooling water of 25° C. was supplied into the coolant groove 15 of the heat dissipator 10 shown in FIG. 6D and the pressure of this water was increased to 3 kgf/cm$^2$, neither leakage nor clogging was recognized.

EXAMPLE 4

Figure 7A:
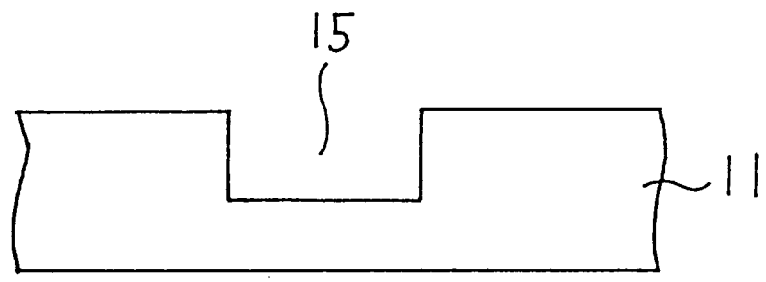
FIGS. 7A to 7D are schematic sectional views showing a process of fabricating a heat dissipator according to Example 4 of the present invention.

A free-standing vapor-deposited diamond thin plate G of 20×20×0.25 mm$^3$ was obtained under conditions similar to those in Example 1. A mask pattern of Al was formed on an upper surface of a substrate consisting of the free-standing diamond thin plate G, and plasma-etched with mixed gas of argon and oxygen under conditions of an oxygen ratio of 20%, total pressure of 0.05 Torr and an RF output of 200 W for 3 hours. After the etching, the Al mask pattern was removed with acid, to obtain a diamond substrate 11 provided with a coolant groove 15 having a width of 500 μm and a depth of 50 μm as shown in FIG. 7A.

Figure 7B:
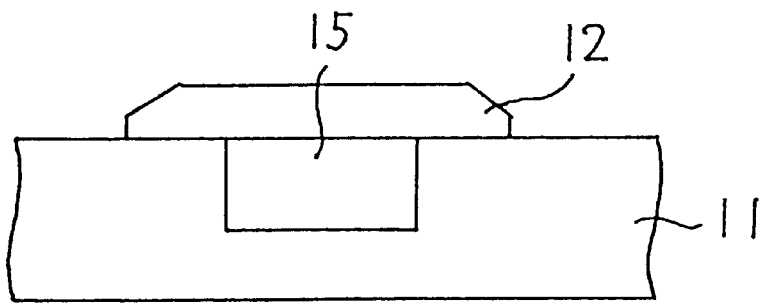
Figure 7C:
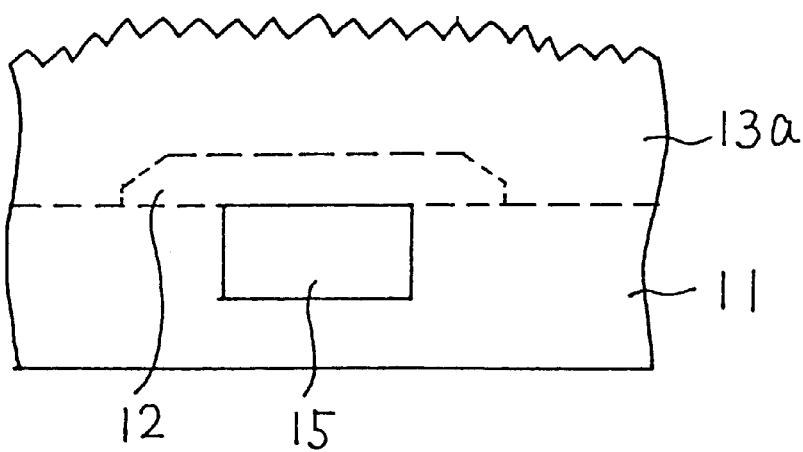
Figure 7D:
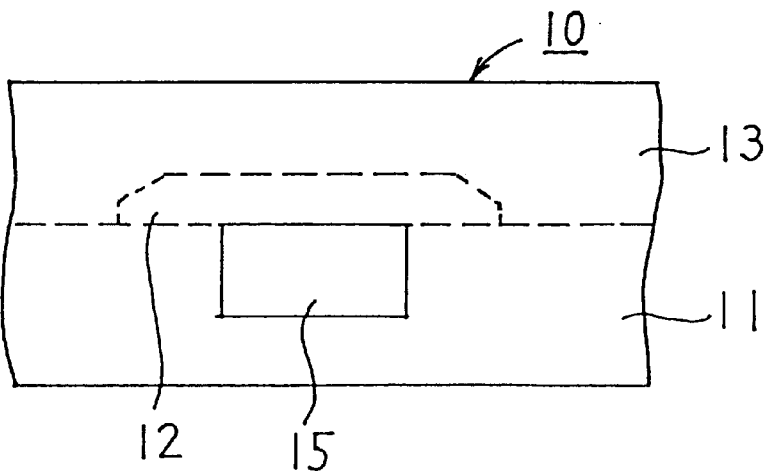

Thereafter a lid 12 was positioned on the coolant groove 15, similarly to Example 1. In Example 4, however, peripheral edge portions of an upper surface of the lid 12 were loosely chamfered, as shown in FIG. 7B. Then, a vapor-deposited diamond layer 13a was grown to cover the lid 12 and the upper surface of substrate 11 similarly to the other Examples, as shown in FIG. 7C. The surface of this grown diamond layer 13a was mechanically polished, thereby obtaining a heat dissipator 10 of 20×20×0.7 mm$^3$ as shown in FIG. 7D. While cooling water of 25° C. was supplied into the coolant groove 15 of this heat dissipator 10 and the pressure of this water was increased to 3 kgf/cm$^2$, neither leakage nor clogging was recognized.

When the heat dissipators 10 obtained in the aforementioned Examples 1 to 4 were subjected to a packaging test as cooling substrates for LD chips, sufficient cooling properties were obtained in all heat dissipators 10. When the heat dissipators 10 were applied to optical windows and subjected to measurement of light transmittance, light absorption by the coolant water was recognized in the portions provided with the coolant grooves 15, while excellent transmittance was attained with the diamond in the remaining regions. When the heat dissipator 10 according to Example 4 was evaluated as an optical window, it was recognized that occurrence of low-quality regions resulting from the corner portions of the lid 12 was limited to be low.

Comparative Example 1

A free-standing vapor-deposited diamond thin plate H of 20×20×0.5 mm$^3$ was obtained as a substrate 11 similarly to Example 1, and a KrF excimer laser beam was linear-focused or point-focused on an upper surface of this substrate 11, to form a coolant groove 15 similar to that shown in FIG. 4A. When a diamond cover layer was grown on the substrate tacked under conditions similar to those of Example 1 but with no lid 12, the diamond cover layer filled up the coolant groove 15. Therefore, it was impossible to feed cooling water into the heat dissipator of comparative example 1.

Comparative Example 2

Two free-standing vapor-deposited diamond thin plates I and J of 20×20×0.5 mm$^3$ and 20×20×0.3 mm$^3$ respectively were obtained similarly to Example 1, and a KrF excimer laser beam was linear-focused or point-focused on an upper surface of a substrate 11 consisting of the diamond thin plate I, to form a coolant groove 15 similar to that shown in FIG. 4A. This coolant groove 15 had a depth of about 125 μm and a width of about 800 μm, and the distance between such grooves 15 was about 4 mm.

On the other hand, the free-standing diamond thin plate J was cut with a laser beam into a lid 12 having a width of 3 mm, and positioned on the coolant groove 15 as shown in FIG. 4B. At this time, Ti, Pt and Au were successively vapor-deposited to metallize an upper surface of a substrate 11 and a lower surface of the lid 12 in the vicinity of the coolant groove 15, and the lid 12 was bonded to the substrate 11 by fusing Au. The thickness of this metallizing layer was 0.2 μm.

A heat dissipator 10 of comparative example 2 was completed by forming a diamond cover layer 13a similarly to Example 1. Then, when cooling water was supplied to the coolant groove 15 and the pressure of this water was increased to 3 kgf/cm$^2$, neither leakage nor clogging was recognized, but a region of 3 mm in width occupied by the lid 12 transmitted no light. In a mounting test for an LD chip employing the heat dissipator 10 of comparative example 2, slight deterioration of the cooling property was recognized as compared with those of Examples 1 to 4.

According to the present invention, as hereinabove described, a heat dissipator having excellent heat dissipativity can be obtained. Further, the overall heat dissipator can be substantially made of only diamond, so that the same is employable not only as an excellent cooling substrate but also as an excellent window for high-energy light. Further, the heat dissipator according to the present invention can be readily fabricated without causing leakage or clogging in the coolant grooves.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat dissipator including a heat-conductive substrate, a lid and a heat-conductive cover layer, wherein
   a major surface of said substrate has therein at least one coolant groove for passing a coolant through said groove,
   said lid is positioned on said coolant groove and covers said coolant groove,
   said cover layer covers said lid and said major surface of said substrate, and
   all of said substrate, said lid and said cover layer consist essentially of diamond, and no material other than diamond substantially exists in respective interfaces therebetween.

2. The heat dissipator in accordance with claim 1, wherein said coolant groove has a depth of at least 20 $\mu$m, and not more than 90% of a thickness of said substrate.

3. The heat dissipator in accordance with claim 1, wherein said coolant groove has a width of at least 20 $\mu$m and not more than 10 mm.

4. The heat dissipator in accordance with claim 1, wherein said at least one coolant groove includes a plurality of said coolant grooves arranged adjacent and spaced apart from one another, each said coolant groove has a groove width and adjacent ones of said grooves are spaced apart from one another by a groove spacing, and a ratio of said groove width to said groove spacing is within the range from 0.02 to 50.

5. The heat dissipator in accordance with claim 1, wherein an inner wall of said coolant groove is surface-treated to be improved in wettability with respect to a coolant to be flowed through said coolant groove.

6. The heat dissipator in accordance with claim 1, wherein said lid has a width that is not more than 5 mm greater than a width of said coolant groove.

7. The heat dissipator in accordance with claim 1, wherein said lid has upper corner portions between upper and side surfaces of said lid oriented away from said substrate, and said upper corner portions are loosely chamfered and covered by said cover layer.

8. The heat dissipator in accordance with claim 1, wherein said major surface of said substrate has therein a lid groove for receiving said lid at least partially in said lid groove, which adjoins and communicates into an upper portion of said coolant groove.

9. The heat dissipator in accordance with claim 8, wherein said lid groove has a depth equal to a thickness of said lid, and said lid is received entirely in said lid groove so that an upper surface of said lid is flush with said major surface of said substrate.

10. The heat dissipator in accordance with claim 8, wherein said lid groove has a depth less than a thickness of said lid, and said lid is received only partially in said lid groove so that an upper surface of said lid protrudes above said major surface of said substrate.

11. The heat dissipator in accordance with claim 1, excluding any adhesive and excluding any brazing metal interposed between or applied to any of said substrate, said lid and said cover layer.

12. The heat dissipator in accordance with claim 1, wherein said heat dissipator is light-transmissive overall, has a heat conductivity of at least 10 W/cm·K, and an electrical resistivity of at least $1\times10^8 \Omega\cdot$cm.

13. The heat dissipator in accordance with claim 1, wherein said substrate has a thickness in a range from 0.07 to 2 mm, said lid has a thickness in a range from 0.02 to 0.5 mm, and said cover layer has a thickness in a range from 0.05 to 0.35 mm.

14. The heat dissipator in accordance with claim 1, wherein said substrate has a thickness in a range from 0.07 to 2 mm, and said coolant groove has a depth as measured from said lid in a range from 50 $\mu$m to 80% of said thickness of said substrate.

15. The heat dissipator in accordance with claim 14, wherein said coolant groove has a width in a range from 40 $\mu$m to 2 mm.

16. The heat dissipator in accordance with claim 1, further comprising a layer of non-diamond carbon having a thickness in a range from 1 nm to 1 $\mu$m on an inner wall surface of said coolant groove.

17. The heat dissipator in accordance with claim 1, wherein said diamond of said substrate includes a surface-treated layer of diamond containing OH groups on an inner wall surface of said coolant groove.

18. The heat dissipator in accordance with claim 1, wherein said heat dissipator is an optically transmissive window.

19. The heat dissipator in accordance with claim 1, wherein said heat dissipator is a heat dissipating substrate for an electronic component.

20. A method of fabricating the heat dissipator according to claim 1, comprising the steps of:
    preparing said heat-conductive substrate;
    forming said coolant groove for passing a coolant therethrough on said major surface of said substrate;
    positioning said lid on said coolant groove for covering said coolant groove; and
    forming said heat-conductive cover layer on said lid and said major surface of said substrate.

21. The method of fabricating the heat dissipator in accordance with claim 20, wherein said step of preparing said heat-conductive substrate comprises vapor-depositing a diamond plate.

22. The method of fabricating the heat dissipator in accordance with claim 20, further comprising a step of preparing said lid by vapor-depositing a diamond plate.

23. The method of fabricating the heat dissipator in accordance with claim 20, wherein said step of forming said heat-conductive cover layer comprises vapor-depositing a diamond layer on said lid and said major surface of said substrate.

24. The method of fabricating the heat dissipator in accordance with claim 20, wherein said step of forming said coolant groove is carried out using an excimer laser.

* * * * *